United States Patent
Guo et al.

(10) Patent No.: US 10,595,477 B2
(45) Date of Patent: Mar. 24, 2020

(54) OXIDE WITH HIGHER UTILIZATION AND LOWER COST

(71) Applicant: Applied Materials, Inc., Santa Clara, CA (US)

(72) Inventors: Lei Guo, Santa Clara, CA (US); Praket P. Jha, San Jose, CA (US); Milind Gadre, Los Altos, CA (US); Deenesh Padhi, Sunnyvale, CA (US); Tza-Jing Gung, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/120,867

(22) Filed: Sep. 4, 2018

(65) Prior Publication Data
US 2019/0074176 A1 Mar. 7, 2019

Related U.S. Application Data

(60) Provisional application No. 62/555,195, filed on Sep. 7, 2017.

(51) Int. Cl.
| | |
|---|---|
| *H01L 21/02* | (2006.01) |
| *C23C 16/40* | (2006.01) |
| *A01G 25/16* | (2006.01) |
| *A01G 25/09* | (2006.01) |
| *F16K 31/02* | (2006.01) |
| *G05D 1/02* | (2020.01) |
| *B25J 19/02* | (2006.01) |
| *B25J 9/04* | (2006.01) |

(Continued)

(52) U.S. Cl.
CPC ............. *A01G 25/16* (2013.01); *A01G 25/09* (2013.01); *A01G 25/167* (2013.01); *B25J 5/007* (2013.01); *B25J 9/0087* (2013.01); *B25J 9/046* (2013.01); *B25J 19/02* (2013.01); *C23C 16/401* (2013.01); *C23C 16/50* (2013.01); *F16K 31/02* (2013.01); *G05D 1/024* (2013.01); *G05D 1/0278* (2013.01); *H01L 21/02164* (2013.01); *H01L 21/02216* (2013.01); *H01L 21/02274* (2013.01); *G05B 2219/2625* (2013.01); *G05D 2201/0201* (2013.01)

(58) Field of Classification Search
None
See application file for complete search history.

(56) References Cited

U.S. PATENT DOCUMENTS

| | | |
|---|---|---|
| 5,545,436 A | 8/1996 | Saito |
| 6,787,483 B1 | 9/2004 | Bayman et al. |

(Continued)

OTHER PUBLICATIONS

Hoex et al., J. Vac. SCi. Technol. A 24 (5), Sep./Oct., 2006, pp. 1823-1830.*

*Primary Examiner* — Asok K Sarkar
(74) *Attorney, Agent, or Firm* — Patterson + Sheridan LLP

(57) ABSTRACT

Aspects disclosed herein relate to methods of depositing pure silicon oxide on a substrate using Octamethylcyclotetrasiloxane (OMCTS) precursor. In one aspect, the method generally includes positioning a substrate in a processing chamber, introducing an oxygen-containing gas into the processing chamber, introducing OMCTS precursor into the processing chamber, and reacting the oxygen-containing gas and the OMCTS precursor to remove carbon and deposit pure silicon oxide on the substrate.

15 Claims, 1 Drawing Sheet

(51) Int. Cl.
  *B25J 9/00* (2006.01)
  *B25J 5/00* (2006.01)
  *C23C 16/50* (2006.01)

(56) References Cited

U.S. PATENT DOCUMENTS

| | | |
|---|---|---|
| 7,087,536 B2 | 8/2006 | Nemani et al. |
| 7,601,651 B2 | 10/2009 | Balseanu et al. |
| 7,902,080 B2 | 3/2011 | Chen et al. |
| 2009/0031953 A1 | 2/2009 | Ingle et al. |
| 2015/0235844 A1* | 8/2015 | Wang ................ H01L 21/02274 438/667 |
| 2017/0137943 A1* | 5/2017 | Mohn ............... H01L 21/67115 |

* cited by examiner

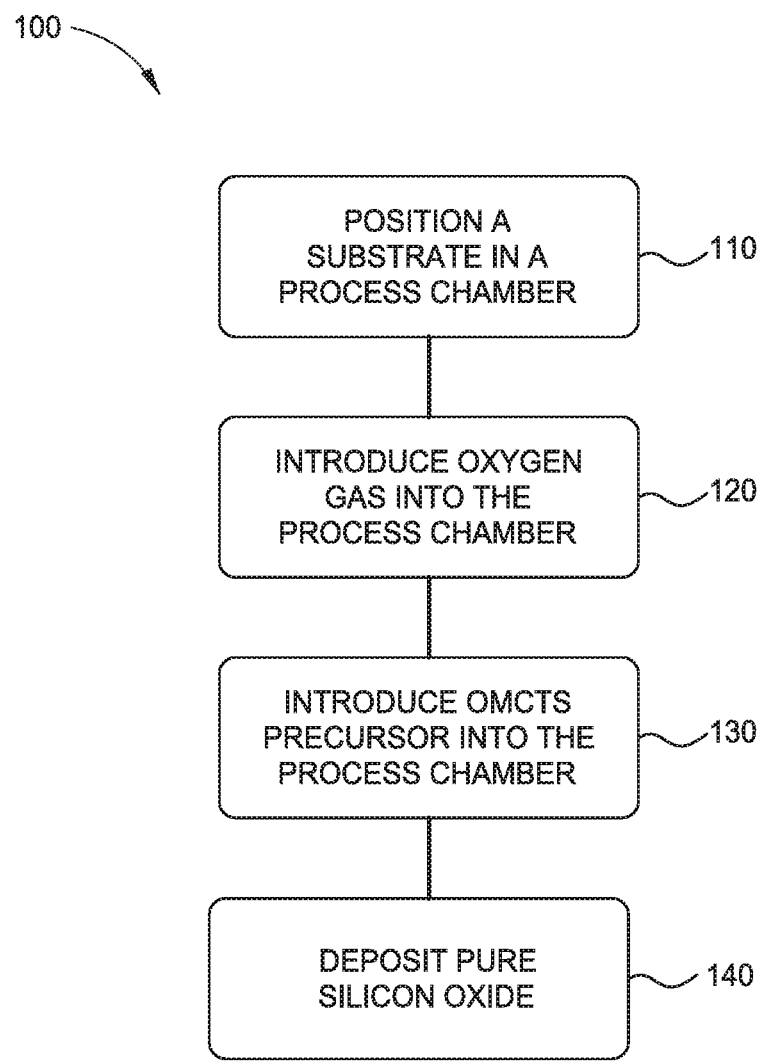

OXIDE WITH HIGHER UTILIZATION AND LOWER COST

CROSS-REFERENCE TO RELATED APPLICATIONS

This application claims benefit of U.S. Provisional Patent Application Ser. No. 62/555,192, filed on Sep. 7, 2017, which is herein incorporated by reference in its entirety.

BACKGROUND

Field

Aspects disclosed herein relate to methods for depositing silicon oxide on a substrate using oxygen and Octamethylcyclotetrasiloxane (OMCTS) precursor.

Description of the Related Art

As device dimensions on integrated circuits continue to shrink, it is becoming increasingly important to deposit high quality layers. Silicon oxide is used as a layer in many semiconductor devices. Current precursors used to deposit silicon oxide, such as tetraethoxysilane (TEOS), problematically exhibit low utilization, which results in a high cost of semiconductor device production. Additionally, current precursors produce films of lower quality and with higher shrinkage, which makes subsequent integration more challenging.

Therefore, there is a need in the art for improved methods and precursors for deposition of silicon oxide.

SUMMARY

Aspects disclosed herein relate to methods of depositing pure silicon oxide on a substrate using OMCTS precursor. In one aspect, the method includes positioning a substrate in a processing chamber, introducing an oxygen-containing gas into the processing chamber, introducing OMCTS precursor into the processing chamber, and reacting the oxygen-containing gas and the OMCTS precursor to remove carbon and deposit pure silicon oxide on the substrate. The oxygen-containing gas is generally introduced into the processing chamber at a high rate, which is sufficient to reduce or remove carbon from the OMCTS precursor and deposit pure silicon oxide. For example, the high rate may be between about 50 milligrams per minute (mg/min) and about 10 mg/min, and about 100 percent of the carbon may be removed. In one example; about 99.5 percent to about 100 percent of the carbon is removed, such as about 99.8 to about 100 percent, or about 99.9 percent to about 100 percent, or about 99.99 percent to about 100 percent.

In one aspect, a method of depositing silicon oxide is disclosed. The method includes positioning a substrate in a process chamber, introducing an oxygen-containing gas into the process chamber; introducing OMCTS precursor into the process chamber, and depositing pure silicon oxide over the substrate.

In another aspect, a method of depositing silicon oxide is disclosed. The method includes positioning a substrate in a process chamber, simultaneously introducing OMCTS precursor and an oxygen-containing gas into the process chamber, and depositing pure silicon oxide over the substrate.

In yet another aspect, a method of depositing silicon oxide is disclosed. The method includes positioning a substrate in a process chamber, introducing an oxygen-containing gas into the process chamber, introducing OMCTS precursor into the process chamber; a ratio of the OMCTS precursor to the oxygen-containing gas introduced into the process chamber being between about 1:2 and about 1:4, and depositing pure silicon oxide over the substrate, a pressure in the process chamber being between about 500 millitorr and about 50 torr and a temperature in the process chamber being between about 300 degrees Celsius and about 500 degrees Celsius.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of its scope. The disclosure may admit to other equally effective aspects.

FIG. 1 is a process flow for a method of depositing silicon oxide on a substrate according to aspects of the present disclosure.

To facilitate understanding, identical reference numerals have been used, where possible, to designate identical elements that are common to the FIGURES. It is contemplated that elements and features of one aspect may be beneficially incorporated in other aspects without further recitation.

DETAILED DESCRIPTION

Aspects disclosed herein relate to methods of depositing pure silicon oxide on a substrate using OMCTS precursor. In one aspect, the method generally includes positioning a substrate in a processing chamber, introducing an oxygen-containing gas into the processing chamber, introducing OMCTS precursor into the processing chamber, and reacting the oxygen-containing gas and the OMCTS precursor to remove carbon and deposit pure silicon oxide on the substrate. The oxygen-containing gas is generally introduced into the processing chamber at a high rate, which is sufficient to remove carbon from the OMCTS precursor and deposit pure silicon oxide.

Methods disclosed herein are generally performed to deposit a silicon oxide layer over any structure in any suitable deposition chamber. Suitable deposition chambers include, but are not limited to, plasma enhanced chemical vapor deposition (PECVD) chambers and systems, such as those available from Applied Materials, Inc. of Santa Clara, Calif., for example the Producer® CVD processing platform.

As used herein the term "pure silicon oxide" generally refers to silicon oxide which has little to no carbon doping. Pure silicon oxide, or good quality oxide, generally has low carbon and hydrogen content. For example, the carbon and hydrogen content is generally less than about 1E20 atoms per cubic centimeter (at/cc). The term "oxygen-containing gas" generally refers to having little to no silicon.

FIG. 1 is a process flow for a method 100 of depositing silicon oxide on a substrate. The method begins at operation 110 by positioning a substrate in a processing chamber. The substrate may be, for example, a 200 mm, 300 mm, or 450 mm silicon wafer. However, other substrates, including those formed from other materials, are contemplated. At operation 120, an oxygen-containing gas is introduced into the process chamber. At operation 130, OMCTS precursor is introduced into the process chamber. At operation 140, the oxygen-containing gas and OMCTS precursor react and carbon is removed from the OMCTS precursor and pure silicon oxide is deposited on the substrate.

During one or more operations of the method 100, the pressure inside the process chamber is generally between about 500 millitorr (mTorr) and about 50 torr (Torr), and the temperature inside the process chamber is generally between 200 degrees Celsius (° C.) and about 700° C., for example between about 300° C. and about 500° C., such as about 425° C.

The amount of oxygen-containing gas introduced into the process chamber is dependent on the amount of OMCTS precursor introduced into the process chamber. The ratio of OMCTS precursor to the oxygen-containing gas is generally greater than about 1:2, for example between about 1:2 and about 1:5, for example, between about 1:2 and about 1:4, such as about 1:3. The ratio of significantly more oxygen over OMCTS precursor facilitates removal of carbon from the OMCTS precursor such that pure, or nearly pure, silicon dioxide is deposited on the substrate. In one example, if 1,000 milligrams per minute (mg/min) of OMCTS precursor is introduced into the process chamber for a 300 mm diameter substrate, then at least 3,000 mg/min of oxygen is introduced into the process chamber.

In one aspect, the oxygen-containing gas and OMCTS precursor are introduced into the process chamber simultaneously. In another aspect, the oxygen-containing gas and the OMCTS precursor are introduced into the process chamber sequentially, for example, the oxygen-containing gas is introduced into the chamber and then the OMCTS precursor is introduced into the chamber, or the OMCTS precursor is introduced into the chamber and then the oxygen-containing gas is introduced into the chamber.

The oxygen-containing gas is generally any suitable oxygen-containing gas, such as diatomic oxygen gas ($O_2$), ozone ($O_3$), and nitrous oxide ($N_2O$). Additionally, one or more carrier gases, such as argon (Ar), helium (He) or other process-inert gases may also be introduced into the chamber with the OMCTS precursor to facilitate flow of the OMCTS precursor. In one aspect, the flow rate of the OMCTS precursor is between about 500 mg/min and about 30,000 mg/min; such as about 1,000 mg/min to about 20,000 mg/min; or such as about 3,000 mg/min to about 15,000 mg/min, or such as about 5,000 mg/min to about 10,000 mg/min. In one example, the flow rate of the oxygen-containing gas is between about 500 mg/min and about 20,000 mg/min. In another example, the flow rate of the oxygen-containing precursor may be selected to flow at predetermined ratio with respect to the OMCTS precursor, as described above. In such an example, the oxygen containing precursor may flow at a rate between about 1,000 mg/min and about 150,000 mg/min, such as about 2,000 mg/min to about 100,000 mg/min, such as about 6,000 mg/min to about 75,000 mg/min, or such as about 10,000 mg/min and about 50,000 mg/min, for example about 20,000 mg/min. In yet another aspect, the flow rate of the oxygen-containing gas, such as oxygen gas, is generally between about 500 standard cubic centimeters per minute (sccm) to about 40,000 sccm.

A high frequency power is generally applied to the process chamber to ignite plasma and facilitate reaction of the oxygen-containing gas with the OMCTS precursor. The high frequency power applied to the process chamber is generally between about 1,000 Watts (W) and about 3,000 W, such as about 2,000 W. The high frequency power may be applied, for example, using RF generator or microwave source. It is contemplated that the plasma generated within the process chamber may be in inductively coupled plasma (ICP) or a capacitively coupled plasma (CCP). In one aspect, the high frequency power is applied using a parallel plate capacitively coupled RF plasma, in which the RF is powered to an electrode and the other electrode is grounded. Additionally or alternatively, a remote plasma generator may be utilized to facilitate ionization of process and/or carrier gases.

In operation, the oxygen-containing gas reacts with the OMCTS precursor to form carbon and/or hydrogen byproducts, such as carbon dioxide ($CO_2$), hydrogen gas ($H_2$), and/or water ($H_2O$), thus removing most, if not all, of the carbon residue and depositing a pure silicon oxide on the substrate. Since the carbon has been removed as a byproduct of the reaction, the deposited silicon oxide has little to no carbon doping.

The high amount by volume of oxygen introduced to the process chamber relative to OMCTS precursor facilitates removal of the carbon to deposit pure silicon oxide. The high frequency applied to the process chamber to ignite plasma further facilitates removal of carbon from the OMCTS precursor to deposit the pure silicon oxide. For example, plasma generally cleaves the Si—$CH_3$ bonds and allows for the silicon (Si) and oxygen (O) to react and form a Si—O—Si network.

Benefits of the present disclosure include increased precursor utilization and reduced cost of ownership as compared to current silicon oxide deposition precursors. For example, OMCTS precursor provides up to 2.5 times higher utilization and at least a 70 percent reduction in cost of ownership as compared to TEOS. In addition, methods disclosed herein reduce pump downtime as compared to increased downtimes when a high flow of TEOS is used and increase overall production efficiency because the same amount of precursor yields more silicon oxide deposition. Further, a silicon oxide layer deposited according to methods disclosed herein using OMCTS precursor exhibits less shrinkage compared to OMCTS such that integration is easier. Even further, silicon oxide deposited according to methods disclosed herein provides better gapfill and better step coverage for device structures. For example, coverage of silicon oxide deposited using TEOS precursor is generally about 65 percent and coverage of silicon oxide deposited according to method disclosed herein using OMCTS precursor is about 77 percent or more.

While the foregoing is directed to aspects of the present disclosure, other and further aspects of the disclosure may be devised without departing from the basic scope thereof, and the scope thereof is determined by the claims that follow.

What is claimed is:

1. A method of depositing silicon oxide, comprising:
   positioning a substrate in a process chamber;
   introducing an oxygen-containing gas into the process chamber;
   introducing OMCTS precursor into the process chamber; and
   depositing, by reacting the introduced oxygen-containing gas and the introduced OMCTS precursor, silicon oxide over the substrate in the process chamber, wherein
   the deposited silicon oxide has a carbon content and a hydrogen content less than 1E20 atoms per cubic centimeter, and
   a flowrate ratio of OMCTS precursor to oxygen-containing gas introduced into the process chamber is between about 1:2 and about 1:4.

2. The method of claim 1, wherein introducing the oxygen-containing gas and introducing the OMCTS precursor occur sequentially.

3. The method of claim 1, wherein a pressure in the process chamber is between about 500 millitorr and about 50 torr.

4. The method of claim 1, wherein a temperature in the process chamber is between about 300 degrees Celsius and about 500 degrees Celsius.

5. The method of claim 1, wherein reacting the oxygen-containing gas and the OMCTS precursor comprises applying a high frequency to the process chamber.

6. The method of claim 5, wherein power of the high frequency is between about 1,000 Watts and about 3,000 Watts.

7. A method of depositing silicon oxide, comprising:
   positioning a substrate in a process chamber;
   simultaneously introducing OMCTS precursor and an oxygen-containing gas into the process chamber; and
   depositing, by reacting the introduced oxygen-containing gas and the introduced OMCTS precursor, silicon oxide over the substrate in the process chamber, wherein
      the deposited silicon oxide has a carbon content and a hydrogen content less than 1E20 atoms per cubic centimeter, and
      a flowrate ratio of OMCTS precursor to oxygen-containing gas introduced into the process chamber is between about 1:2 and about 1:4.

8. The method of claim 7, wherein a flow rate of the OMCTS precursor is between about 500 milligrams per minute and about 30,000 milligrams per minute.

9. The method of claim 7, wherein a flow rate of the oxygen-containing gas is between about 500 mg/min and about 20,000 mg/min.

10. The method of claim 7, wherein a pressure in the process chamber is between about 500 millitorr and about 50 torr.

11. The method of claim 7, wherein a temperature in the process chamber is between about 300 degrees Celsius and about 500 degrees Celsius.

12. The method of claim 7, wherein reacting the oxygen-containing gas and the OMCTS precursor comprises applying a high frequency to the process chamber.

13. The method of claim 12, wherein a power of the high frequency is between about 1,000 Watts and about 3,000 Watts.

14. The method of claim 7, wherein the oxygen-containing gas is oxygen gas ($O_2$).

15. A method of depositing silicon oxide, comprising:
   positioning a substrate in a process chamber;
   introducing an oxygen-containing gas into the process chamber;
   introducing OMCTS precursor into the process chamber, a flowrate ratio of the OMCTS precursor to the oxygen-containing gas introduced into the process chamber being between about 1:2 and about 1:4; and
   depositing, by using the introduced oxygen-containing gas and the introduced OMCTS precursor, silicon oxide over the substrate in the process chamber, a pressure in the process chamber being between about 500 millitorr and about 50 torr and a temperature in the process chamber being between about 300 degrees Celsius and about 500 degrees Celsius, wherein the deposited silicon oxide has a carbon content and a hydrogen content less than 1E20 atoms per cubic centimeter.

* * * * *